United States Patent [19]

Thornberry

[11] 4,267,528
[45] May 12, 1981

[54] RADIO FREQUENCY INTERFERENCE SUPPRESSION APPARATUS

[75] Inventor: Gerald E. Thornberry, Indianapolis, Ind.

[73] Assignee: RCA Corporation, New York, N.Y.

[21] Appl. No.: 38,101

[22] Filed: May 11, 1979

[51] Int. Cl.³ .................. H03H 7/01; H04B 1/10; H04N 5/21
[52] U.S. Cl. ................... 333/12; 333/185; 358/36; 361/330; 455/307; 455/310
[58] Field of Search ............... 333/12, 167, 175, 176, 333/185; 361/328, 330, 399; 325/357, 313, 352, 472, 477; 358/36, 167; 455/283, 286, 287, 296–300, 307, 310, 347

[56] References Cited

U.S. PATENT DOCUMENTS

| | | | |
|---|---|---|---|
| 2,355,182 | 8/1944 | Shoup | 325/357 X |
| 2,935,639 | 5/1960 | Mothiron | 315/1 |
| 4,096,516 | 6/1978 | Pritchard | 358/31 |
| 4,122,416 | 10/1978 | Oblak et al. | 333/12 X |

*Primary Examiner*—Paul L. Gensler

*Attorney, Agent, or Firm*—E. M. Whitacre; W. H. Meagher; W. B. Yorks, Jr.

[57] ABSTRACT

Apparatus is provided for suppressing radio frequency interference radiation at a circuit connection point. The apparatus includes a capacitor having first and second terminals, the first of which is coupled to a substantially planar plate of the capacitor. The first terminal is coupled to the circuit connection point, which may otherwise act as an RFI antenna. The second capacitor terminal is coupled to a point of reference potential for radio frequencies. The capacitor is oriented when mounted so that the planar plate opposes and is substantially parallel to a metallic surface which is at the radio frequency reference potential (e.g., ground). The capacitor suppresses RFI radiation from the circuit connection point by conducting a portion of the RFI energy at that point to the point of RFI reference potential by way of the first terminal, the body of the capacitor, and the second terminal. A second portion of the RFI energy at the circuit connection point is radiated from the planar plate of the capacitor to the opposed metallic surface.

8 Claims, 6 Drawing Figures

RADIO FREQUENCY INTERFERENCE SUPPRESSION APPARATUS

This invention relates to radio frequency interference (RFI) suppression apparatus, and in particular, to a circuit arrangement which suppresses RFI radiation at an opening of an RFI-shielded enclosure.

Many electronic instruments, such as computers and radio and television receivers, contain circuits which produce or process electronic signals. In doing so, the circuits can also radiate radio frequency signals from their circuit elements and interconnections to other circuitry or even other instruments. The interfering radio frequency signals can intermodulate with other signals in the instrument, thereby creating noise signals or interference patterns on the screen of a television receiver. To prevent such undesirable radio frequency interference, steps must be taken to contain or prevent the radiation of RFI signals in the instrument.

A common step employed to suppress RFI interference is to enclose the source of RFI radiation in a metallic enclosure. The enclosure will confine RFI radiation within its boundaries, and is typically grounded to prevent the radiation of RFI signals by the enclosure itself. However, the enclosure will generally have openings in its walls to permit the entry of power and signal conductors. These openings can permit RFI radiation to escape from the interior of the enclosure, which can lead to RFI contamination of nearby circuitry. More significantly, the conductors which leave the enclosure will themselves act as RFI antennas for high frequency radiation. Even when all of the signal and power conductors are shielded, as by the use of coaxial cable, there will generally be some circuit points at which the conductors emerge from the shielding to become radiating antennas for RFI signals. Furthermore, extensive coaxial cabling is undesirable, since it is both expensive and cumbersome. Thus, other steps must be taken to prevent RFI radiation from conductors which emerge from an RFI-shielded enclosure.

In accordance with the principles of the present invention, apparatus is provided for suppressing RFI interference at an unshielded circuit connection point. The apparatus comprises a capacitor having first and second terminals, the first of which is coupled to a substantially planar plate of the capacitor. The first terminal is coupled to the unshielded circuit connection point which may otherwise act as an RFI antenna. The second capacitor terminal is coupled to a point of reference potential for radio frequencies. The capacitor is oriented when mounted so that the planar plate opposes and is substantially parallel to a metallic surface which is at the radio frequency reference potential (e.g., ground). The capacitor suppresses RFI radiation from the unshielded circuit connection point by conducting a portion of the RFI energy at that point to the point of RFI reference potential by way of the first terminal, the body of the capacitor, and the second terminal. A second portion of the RFI energy at the circuit connection point is radiated from the planar plate of the capacitor to the opposed metallic surface.

Figure 1:
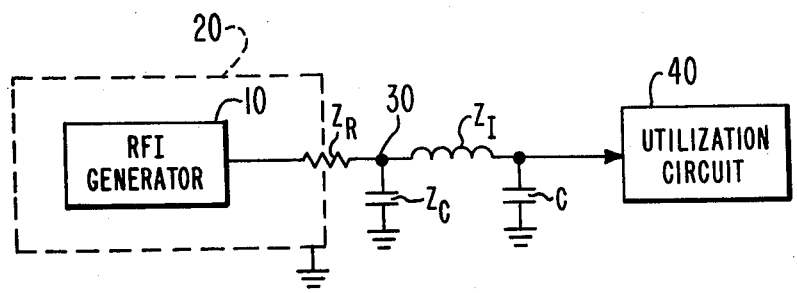
FIG. 1 illustrates, partially in block diagram form and partially in schematic diagram form, a circuit embodying the principles of the present invention.

Referring to FIG. 1, an RFI generator 10 is shown enclosed in a grounded, metallic enclosure 20. The RFI generator 10 may be, for example, an integrated circuit device, a diode, or a transistor which radiates RFI energy. A specific RFI generator to which the principles of the present invention have been applied to suppress RFI radiation is a clocked charge-coupled device (CCD) comb filter integrated circuit used to separate the luminance and chrominance signals in a television receiver, as described in U.S. Pat. No. 4,096,516, issued June 20, 1978 to D. H. Pritchard. An incoming video signal is clocked through three CCD delay line stages of the comb filter, the outputs of which are combined to develop separate luminance and chrominance signals. The three CCD delay line stages are clocked at a 10.7 MHz rate. This clock frequency and higher order harmonics thereof appear at the power and output terminals of the CCD comb filter and its shielding enclosure and, unless suppressed, will be radiated to other circuits of the television receiver. While these radiated signals pose no radiation threat to the user of the receiver, the radiated signals are of sufficient strength to cause intermodulation problems in other circuitry in the receiver. The harmonics of the 10.7 MHz clock signal extend through the I.F., VHF, FM and UHF bands of the radio frequency spectrum, and can intermodulate with received television signals to cause severe beat patterns on several viewed channels. The radiated RFI signals must therefore be suppressed to prevent this intermodulation distortion.

RFI signal radiation is reduced to acceptable levels in accordance with the apparatus of the present invention. A typical signal conductor from the RFI generator 10 is shown exiting the metallic enclosure 20 by way of an impedance $Z_R$. The impedance $Z_R$ is coupled to a second impedance $Z_I$ in series with the signal path, and a capacitor $Z_C$ coupled in shunt to ground, at a node 30. The other end of impedance $Z_I$ is coupled to ground by a second capacitor $C_2$, and to a utilization circuit 40. When employed in conjunction with the CCD comb filter device described above, the circuit elements $Z_R$, $Z_C$, $Z_I$ and $C_2$ cooperate to form a low pass filter in the luminance or chrominance signal paths. The luminance information, for instance, is contained in a bandwidth extending from zero to four MHz. This low pass filter rolls off at frequencies above four MHz so that only the luminance information is contained on the signal conductor which is coupled to the utilization circuit 40.

Impedances $Z_R$ and $Z_I$ present high impedances to RFI energy contained on the signal path from the RFI generator 10. These components may comprise elements such as ferrite beads, resistors, or inductors. In the illustrative embodiments shown in the FIGURES, $Z_R$ is a resistor and $Z_I$ is an inductor. Resistor $Z_R$ minimizes the conduction of RFI energy from the interior of the enclosure 20 to the node 30, and inductor $Z_I$ minimizes the conduction of RFI energy to the utilization circuit 40.

The capacitor $Z_C$ presents a low impedance to RFI energy at node 30. Without this capacitor, RFI energy would be freely radiated by the leads of resistor $Z_R$ and inductor $Z_I$ to other areas of the instrument. At higher harmonic frequencies of the 10.7 MHz clock signal, for instance, these small leads act as antennas for RFI energy. However, capacitor $Z_C$ effectively acts as a bypass capacitor for most of the RFI energy at node 30, conducting it harmlessly to ground. Furthermore, capacitor $Z_C$ is so oriented that its RFI "hot" plate (i.e., the plate coupled to node 30) is closely spaced to and faces the metallic enclosure 20. RFI energy which is radiated from this plate of the capacitor is narrowly confined to the area between the capacitor $Z_C$ and the enclosure 20. Energy radiated from the capacitor to the enclosure is then conducted to ground by the metallic enclosure.

Figure 2:
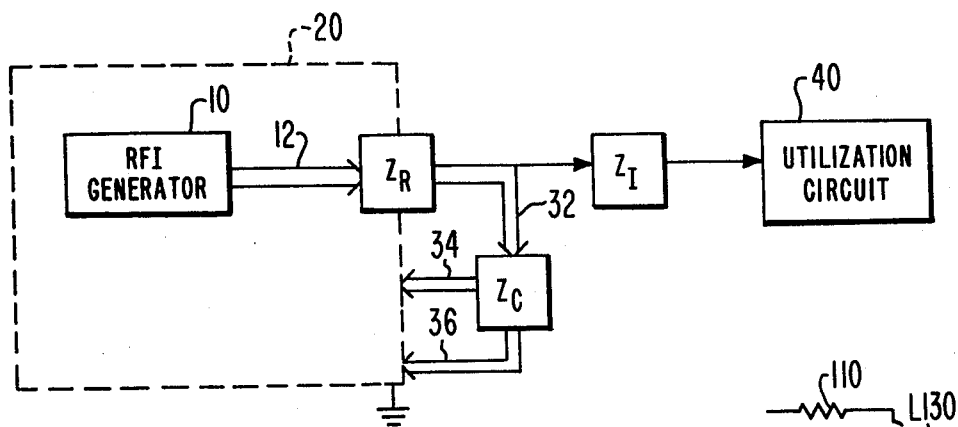
FIG. 2 illustrates, in block diagram form, the signal and RFI energy paths of the circuit of FIG. 1.

This flow of signal and RFI energy is more fully shown in FIG. 2. An output signal and RFI energy are coupled from the RFI generator 10 to the $Z_R$ impedance as shown by arrow 12. The output signal and some of the RFI energy are coupled to impedance $Z_I$ and $Z_C$ at the exterior of the enclosure 20 from impedance $Z_R$. Since $Z_I$ presents a high impedance to the RFI energy, the output signal is coupled to the utilization circuit 40 substantially free of RFI. The RFI energy flows to the low RFI impedance $Z_C$ by way of the signal path indicated by arrow 32. The RFI energy is then directly coupled back to the grounded enclosure 20 through the impedance $Z_C$ as shown by arrow 36, and is radiated back to the enclosure 20 from the impedance $Z_C$ as shown by arrow 34.

Figure 3:
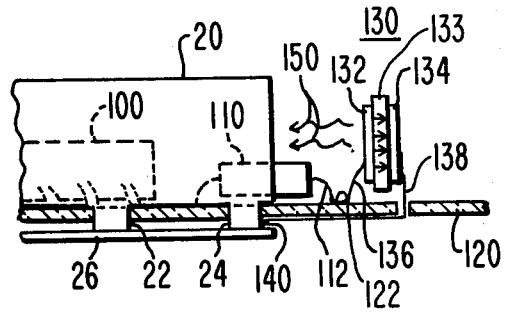
FIG. 3 illustrates a partial cross-sectional view and partial side view of an embodiment of the present invention.

An arrangement of circuit elements in accordance with the principles of the present invention is shown in FIG. 3. A metallic enclosure 20 is mounted on a printed circuit board 120 by inserting tabs 22 and 24 into holes in the board. The enclosure 20 contains an integrated circuit 100 which is a source of RFI energy. RFI radiation through the printed circuit board 120 is contained by a metallic shield 26 which is connected to the tabs beneath the circuit board. Signals from the integrated circuit 100 are coupled outside the enclosure 20 by a resistor 110, which is coupled to the integrated circuit 100 by a copper printed circuit connection on the printed circuit board (not shown). One terminal 112 of the resistor 110 is located external to the enclosure and is soldered to a printed circuit connection 122 on the surface of the board 120. A ceramic disc capacitor 130 is located external to the enclosure 20 and has a terminal 136 soldered to the printed circuit connection 122, and a terminal 138 connected through a hole in the printed circuit board 120 to the enclosure tab 24 at solder connection 140.

The ceramic disc capacitor comprises a ceramic wafer dielectric 133 located between two metallic plates 132 and 134. The RFI energy present at resistor terminal 112, printed circuit connection 122, and capacitor terminal 136, is coupled to plate 132, making this plate "hot" with RFI energy. The capacitor plate 134 is "cold" with respect to RFI energy, since it is connected to the enclosure 20 by terminal 138. Thus, the "hot" plate will radiate RFI energy, whereas the plate 134 will not. RFI energy on plate 134 will be returned to the enclosure 20, which is at the RFI reference potential (e.g., ground).

Without the ceramic disc capacitor, resistor terminal 112 and printed circuit connection 122 would act as an antenna for RFI energy, radiating this energy to nearby circuitry. However, the capacitor 130 prevents this radiation by conducting a portion of the RFI energy through the ceramic wafer 133 to the "cold" plate 134, and thence to ground by way of terminal 138. The balance of the RFI energy at the terminals 112, 136 and the connection 122 is radiated from the surface of the plate 132 toward the metallic enclosure 20, as shown by arrows 150. This RFI energy is thus confined to the area between the ceramic disc capacitor 130 and the enclosure 20, and is returned to ground by way of the enclosure 20.

It may be seen that the circuit arrangement of FIG. 3 actually includes two filter circuits for RFI energy. The resistor terminal 112, the printed circuit connection 122, and the capacitor terminal 136 together comprise a conductor with an inductive reactance. This inductive reactance is coupled to ground by the ceramic disc capacitor body, including the plate 132, the wafer 133, the plate 134, and terminal 138. The inductive reactance is also coupled to ground through the plate 132 and the enclosure 20 by way of the air dielectric therebetween. Consequently, it is seen that the plate 132 and the enclosure 20 serve as the plates of a second capacitor, which has a dielectric consisting of the air between them.

Figure 4:
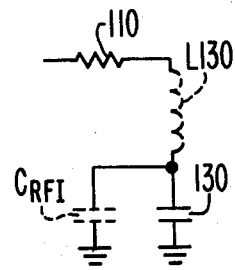
FIG. 4 illustrates, in schematic diagram form, the circuit elements of the embodiment of FIG. 3.
Figure 5:
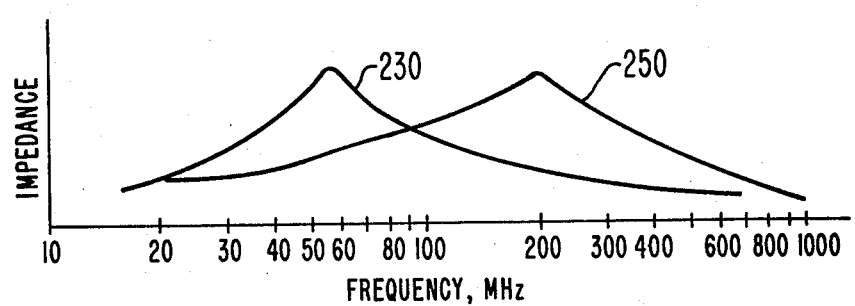
FIG. 5 illustrates typical response curves of the circuit of FIGS. 3 and 4.

The filter circuits thus formed by these elements is shown in FIG. 4. The inductive reactance is shown as L130, and the air dielectric capacitor is shown as $C_{RFI}$. The two filter circuits, which share the same inductor L130, will have resonant frequencies determined by the length of the inductively reactive elements and the values of the capacitors. Typical response curves for the two filter circuits are shown in FIG. 5. For example, if the ceramic disc capacitor 130 has a value of 150 pf, and the combined length of terminal 112, connection 122, and terminal 136 is 0.75 inches, this filter circuit will have a resonant frequency between 50 and 60 MHz, as illustrated by response curve 230. (This resonant frequency can be increased or decreased by decreasing or increasing the length of the inductively reactive elements, respectively.) Furthermore, if the ceramic disc capacitor 130 has a diameter of approximately one-half inch and is closely spaced with respect to the enclosure 20, capacitor $C_{RFI}$ will have a value on the order of 10 to 20 pf, and the filter circuit containing this capacitor will have a resonant frequency of approximately 200 MHz, as shown by response curve 250. Since the two resonant frequencies are separated by approximately 150 MHz, the impedance of the circuits over the range of RFI frequencies will always be low, since the lower impedance circuit will predominate at any particular frequency. For instance, in the case of the CCD comb filter device described above, it is desirable to prevent RFI radiation over the range of VHF television frequencies (55 to 216 MHz) and over the range of UHF television frequencies (470 to 890 MHz) to prevent interfering beat patterns in the received television image. It is seen that a low RFI impedance is provided by response curve 230 (L130 and capacitor 130) from 55 MHz to approximately 90 MHz, and that above 90 MHz, response curve 250 predominates (L130 and $C_{RFI}$). Therefore, the circuit arrangement of FIGS. 3 and 4 is seen to provide a low impedance for RFI energy over the full range of VHF and UHF television frequencies.

Figure 6:
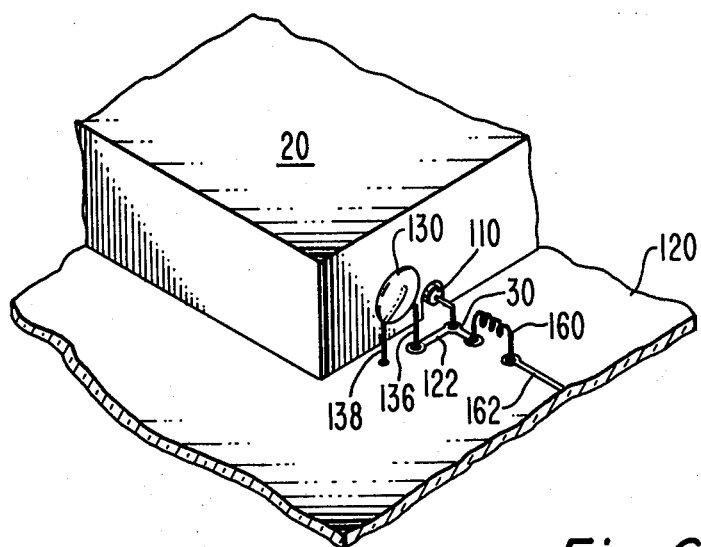
FIG. 6 illustrates a perspective view of an embodiment of the present invention.

A perspective view of an arrangement in accordance with the present invention is shown in FIG. 6. A terminal of a resistor 100 extends through an opening in metallic enclosure 20 and into a hole in printed circuit board 120. A metallic printed circuit connection 122 on the surface of the board 120 connects the resistor 110 to a capacitor 130 and an inductor 160. The junction of these three circuit elements comprises the radiating node 30, shown in FIG. 1. Capacitor 130 has a terminal 136 connected to the printed circuit connection 122 and to the "hot" side of the capacitor, which faces the enclosure 20. The "cold" side terminal 138 is connected through a hole in the circuit board 120 to the enclosure 20 on the underside of the board (not shown in this illustration). The inductor 160 is coupled between the printed circuit connection 122 and a second metallic printed circuit connection 162, which is a signal path to other utilization circuitry (not shown). RFI energy from node 30 is bypassed to the grounded enclosure 20 through the capacitor 130, and is radiated back to the enclosure from the "hot" side of the capacitor.

In the examples shown in the FIGURES, the enclosure 20 is utilized as the grounded plate of the air dielectric capacitor $C_{RFI}$, since it is conveniently located near the RFI radiating node 30 in these examples. However, it is to be understood that any convenient point of RFI reference potential, such as a nearby printed circuit copper ground plane or a chassis rail, may be used as the low potential plate of this capacitor when located parallel to and opposing the "hot" plate of the capacitor 130. Also, the impedance $Z_R$, $Z_I$ and capacitor $C_2$, which form the low pass filter described in FIG. 1, may be omitted if low pass filtering is not desired on the radiating conductor. This could be the case, for instance, when capacitor $Z_C$ is used to suppress RFI radiation from a power conductor which enters the enclosure 20.

What is claimed is:

1. Apparatus for suppressing radio frequency interference radiation from a circuit connection point comprising:
    a metallic surface coupled to a point of radio frequency reference potential; and
    a first capacitor having a substantially planar first plate and a second plate, a first terminal coupled to said first plate and a second terminal coupled to said second plate, said first terminal being coupled to said circuit connection point and said second terminal being coupled to a point of radio frequency reference potential, said first capacitor acting to conduct a first portion of radio frequency interference energy from said circuit connection point to said point of radio frequency reference potential,
    wherein said first capacitor is located in close proximity to said metallic surface with said substantially planar first plate oriented between said metallic surface and said second plate so as to oppose said metallic surface in a substantially parallel relationship, thereby forming a second capacitor including said first plate and said metallic surface with an air dielectric therebetween, said second capacitor exhibiting a capacitance of at least ten picofarads and acting to conduct a further portion of radio frequency interference energy from said circuit connection point and said first terminal to said metallic surface.

2. Apparatus for suppressing radio frequency interference radiation from a conductor located at an opening of an enclosure coupled to a point of radio frequency reference potential comprising a first capacitor having a substantially planar first plate coupled to a first terminal, and a second plate coupled to a second terminal, said first terminal being coupled to said conductor in close proximity to said opening and said second terminal being coupled to said enclosure,
    wherein said substantially planar first plate of said first capacitor is oriented between said enclosure and said second plate so as to oppose a surface of said enclosure in a substantially parallel relationship, thereby forming a second capacitor including said first plate of said first capacitor and said surface of said enclosure with an air dielectric therebetween, said second capacitor having a value of at least ten picofarads for conducting radio frequency interference energy from said conductor to said enclosure.

3. Apparatus for removing radio frequency interference energy from a signal occupying a given range of frequencies on a signal path comprising:
    means having an output terminal for developing a signal which is subject to contamination by radio frequency interference energy;
    first means, having an input terminal coupled to said signal developing means output terminal, and an output terminal, for presenting a high impedance to radio frequency interference energy;
    second means, having an input terminal coupled to said output terminal of said first high impedance means, and an output for presenting a high impedance to radio frequency interference energy;
    a substantially planar conductive surface coupled to a point of radio frequency reference potential; and
    a capacitor having a substantially planar first plate coupled to an input terminal and a second plate coupled to an output terminal which is coupled to a point of reference potential, said input terminal being coupled between said first and second high impedance means, and said substantially planar first plate being oriented between said second plate and said planar conductive surface in a substantially parallel relationship with said planar conductive surface,
    wherein said first high impedance means and said capacitor comprise a filter for attenuating signals occupying a first portion of said given range of frequencies, and said first plate and said planar conductive surface comprise a second capacitor with an air dielectric therebetween and exhibiting a capacitance of at least ten picofarads, said first high impedance means and said second capacitor comprising a second filter for attenuating signals occupying a second portion of said given range of frequencies.

4. Apparatus for suppressing radio frequency interference radiation from a circuit connection point comprising:
    a substantially planar metallic surface coupled to a point of radio frequency reference potential;
    a metallic conductor which is capable of emitting radio frequency radiation;
    a first capacitor including first and second plates coupled to respective first and second terminals and separated by a dielectric material, said first terminal being coupled to said metallic conductor and said second terminal being coupled to a point of radio frequency reference potential, said capacitor being oriented so that said first plate opposes said metallic surface in a substantially parallel arrangement, wherein said first plate and said metallic surface form a second capacitor having an air dielectric therebetween.

5. The apparatus of claim 4, wherein said metallic conductor, said first capacitor terminal, and said first capacitor form a first resonant circuit and said metallic conductor, said first capacitor terminal, and said second capacitor form a second resonant circuit.

6. The apparatus of claim 5, wherein said first and second resonant circuits have different resonant frequencies at which they exhibit maximum impedances.

7. Apparatus for suppressing radio frequency interference radiation at the opening of a metallic shielding enclosure which is coupled to a point of radio frequency reference potential comprising:

means, located within said shielding enclosure, and having an output terminal, for developing a signal which is subject to contamination with radio frequency energy;

a signal path extending through the opening of said enclosure and coupled to said output terminal;

a ceramic disc capacitor having first and second plates connected to respective first and second terminals, said plates being separated by a ceramic wafer, said first terminal being coupled to said signal path at a point external to said enclosure and in close proximity thereto, and said second terminal being coupled to said enclosure, wherein said first plate is oriented with respect to a surface of said enclosure between said surface and said ceramic wafer so as to oppose said surface in a substantially parallel relationship, thereby cooperatively forming a second capacitor, the plates of which are comprised by said first plate of said ceramic disc capacitor and said surface of said enclosure, said second capacitor having an air dielectric between its plates.

8. The apparatus of claim 7, wherein said signal developing means comprises an integrated circuit chip.

* * * * *